(12) United States Patent
Swenberg et al.

(10) Patent No.: US 11,322,347 B2
(45) Date of Patent: May 3, 2022

(54) CONFORMAL OXIDATION PROCESSES FOR 3D NAND

(71) Applicant: Applied Materials, Inc., Santa Clara, CA (US)

(72) Inventors: Johanes F. Swenberg, Los Gatos, CA (US); Taewan Kim, San Jose, CA (US); Christopher S. Olsen, Fremont, CA (US); Erika Hansen, San Jose, CA (US)

(73) Assignee: Applied Materials, Inc., Santa Clara, CA (US)

( * ) Notice: Subject to any disclaimer, the term of this patent is extended or adjusted under 35 U.S.C. 154(b) by 176 days.

(21) Appl. No.: 16/660,646

(22) Filed: Oct. 22, 2019

(65) Prior Publication Data

US 2020/0194251 A1 Jun. 18, 2020

Related U.S. Application Data

(60) Provisional application No. 62/780,002, filed on Dec. 14, 2018.

(51) Int. Cl.
| | |
|---|---|
| *H01L 21/02* | (2006.01) |
| *H01L 27/11521* | (2017.01) |
| *H01L 21/28* | (2006.01) |
| *H01L 27/11568* | (2017.01) |

(52) U.S. Cl.
CPC .... *H01L 21/0223* (2013.01); *H01L 21/28202* (2013.01); *H01L 27/11521* (2013.01); *H01L 27/11568* (2013.01)

(58) Field of Classification Search
CPC ......... H01L 27/11568; H01L 21/67115; H01L 21/28202; H01L 21/02164; H01L 21/02233; H01L 21/02252; H01L 21/0223
See application file for complete search history.

(56) References Cited

U.S. PATENT DOCUMENTS

| | | | |
|---|---|---|---|
| 6,436,848 B1* | 8/2002 | Ramkumar | ............... C23C 8/34 |
| | | | 438/777 |
| 6,881,682 B2* | 4/2005 | Zheng | ................. H01L 27/0805 |
| | | | 257/E21.008 |
| 7,972,441 B2 | 7/2011 | Yokota et al. | |
| 8,741,785 B2 | 6/2014 | Olsen et al. | |
| 9,117,661 B2 | 8/2015 | Yokota et al. | |

(Continued)

*Primary Examiner* — Savitri Mulpuri
(74) *Attorney, Agent, or Firm* — Patterson + Sheridan, LLP

(57) ABSTRACT

Embodiments described herein generally relate to conformal oxidation processes for flash memory devices. In conventional oxidation processes for gate structures, growth rates have become too fast, ultimately creating non-conformal films. To create a preferred growth rate for $SiO_2$ on $SiN_x$ films, embodiments in this disclosure use a thermal combustion of a ternary mixture of $H_2+O_2+N_2O$ to gain $SiO_2$ out of Si containing compounds. Using this mixture provides a lower growth in comparison with using only $H_2$ and $O_2$, resulting in a lower sticking coefficient. The lower sticking coefficient allows an optimal amount of atoms to reach the bottom of the gate, improving the conformality in 3D NAND $SiO_2$ oxidation layers, specifically for ONO replacement tunneling gate formation.

12 Claims, 7 Drawing Sheets

(56) References Cited

U.S. PATENT DOCUMENTS

| | | | |
|---|---|---|---|
| 9,390,930 B2 | 7/2016 | Rogers et al. | |
| 9,514,968 B2 | 12/2016 | Tjandra et al. | |
| 10,020,186 B2 | 7/2018 | Tjandra | |
| 10,604,842 B2* | 3/2020 | Harada | C23C 16/45565 |
| 2007/0093013 A1* | 4/2007 | Chua | H01L 21/02332 |
| | | | 438/197 |
| 2009/0124096 A1* | 5/2009 | Koo | H01L 21/02332 |
| | | | 438/776 |
| 2010/0029091 A1* | 2/2010 | Jeong | H01L 21/3143 |
| | | | 438/762 |
| 2010/0003171 A1 | 12/2010 | Yao et al. | |
| 2011/0002507 A1 | 10/2011 | Yokota et al. | |
| 2012/0156891 A1* | 6/2012 | Lin | H01L 21/28185 |
| | | | 438/773 |
| 2014/0349491 A1* | 11/2014 | Tjandra | H01L 29/04 |
| | | | 438/773 |
| 2015/0140834 A1* | 5/2015 | Kashefi | H01L 21/28194 |
| | | | 438/771 |
| 2015/0235843 A1* | 8/2015 | Hirose | H01L 21/02211 |
| | | | 438/763 |
| 2015/0380241 A1* | 12/2015 | Yu | H01L 21/3086 |
| | | | 257/401 |
| 2017/0365450 A1* | 12/2017 | Bi | H01J 37/32862 |
| 2018/0000760 A1 | 3/2018 | Olsen et al. | |

* cited by examiner

CONFORMAL OXIDATION PROCESSES FOR 3D NAND

CROSS-REFERENCE TO RELATED APPLICATIONS

This application claims priority to U.S. Provisional Patent Application No. 62/780,002, filed Dec. 14, 2018, which is herein incorporated by reference in its entirety.

BACKGROUND

Field

Embodiments described herein generally relate to manufacturing semiconductor devices and, more particularly, to conformal oxidation processes for flash memory devices.

Description of the Related Art

In the manufacture of semiconductor devices, the production of silicon integrated circuits has placed difficult demands on fabrication steps to increase the number of devices while decreasing the minimum feature sizes on a chip. These demands have extended to fabrication steps including depositing layers of different materials onto difficult topologies and etching further features within those layers. This is especially an issue in the manufacturing of next generation NAND flash memory. NAND is a type of non-volatile storage technology that does not require power to retain data. To increase memory capacity within the same physical space, a three-dimensional NAND (3D NAND) design has been developed. Such a design typically introduces alternating oxide layers and nitride layers which are etched to produce a desired structure having one or more faces extending substantially perpendicularly to the substrate. Such design considerations have moved the field from oxidation of relatively low aspect ratio structures, for example, 10:1 aspect ratios, to high aspect ratio (HAR) structures, for example, 40:1 or greater aspect ratios.

Prior fabrication steps have included methods for filling gaps and trenches in HAR structures. However, new fabrication steps are required to conformally deposit layers on the faces of HAR structures, rather than simply filling gaps and trenches. Conventional oxidation processes of nitride layers grow very fast during the initial stages of growth (<3 nm). Typically, oxidation processes either have too fast of growth rates to produce silicon oxide ($SiO_2$) films on silicon nitride ($SiN_x$) films or a negligible growth rate on silicon nitride films. When a growth rates become too fast, it results in atoms typically sticking to only local areas on SiNx, leading to less surface coverage ultimately resulting in a non-conformal $SiO_2$ film.

Accordingly, there is a need for oxidation processes with reduced growth rates and increased surface coverage, resulting in conformal $SiO_2$ films.

SUMMARY

One or more embodiments described herein generally provide processes used to form portions of a flash memory device.

In one embodiment, a method of processing a substrate includes exposing a structure formed on a substrate to a process gas by flowing a hydrogen gas, an oxygen gas, and a nitrous oxide gas into a processing volume of a chamber body, wherein a concentration of the hydrogen gas is between about 1% and about 10% by volume, a concentration of the oxygen gas is between 0% and about 40% by volume, and a concentration of nitrous oxide gas is between about 50% and about 98% by volume within the processing volume; heating a substrate support to a temperature between about 700° C. and about 1100° C.; and controlling a processing pressure within the processing volume to a pressure between about 1 Torr and about 20 Torr.

In another embodiment, a method of processing a substrate includes exposing a structure formed on a substrate to a process gas by flowing a hydrogen gas, an oxygen gas, and a nitrous oxide gas into a processing volume of a chamber body, wherein a concentration of the hydrogen gas is between about 1% and about 10% by volume, a concentration of the oxygen gas is between about 5% and about 20% by volume, and a concentration of nitrous oxide gas is between about 70% and about 95% by volume within the processing volume, wherein none of the components of the process gas are exposed to a plasma during the process of exposing of the structure to the process gas; heating a substrate support to a temperature between about 800° C. and about 1100° C.; and controlling a processing pressure within the processing volume to a pressure between about 9 Torr and about 20 Torr.

In another embodiment, a method of processing a substrate includes initiating conformal oxidation of high aspect ratio structures of the substrate comprising: flowing a hydrogen gas, an oxygen gas, and a nitrous oxide gas into a processing volume of a chamber body, wherein a volume concentration of the hydrogen gas is between about 5% and about 10%, a volume concentration of the oxygen gas is between about 20% and about 35%, and a volume concentration of nitrous oxide gas is between about 55% and about 75% within the processing volume; heating a substrate support to a temperature between about 800 degrees C. and about 1100 degrees C.; and controlling a processing pressure within the chamber body between about 9 Torr and about 18 Torr.

BRIEF DESCRIPTION OF THE DRAWINGS

So that the manner in which the above recited features of the present disclosure can be understood in detail, a more particular description of the disclosure, briefly summarized above, may be had by reference to embodiments, some of which are illustrated in the appended drawings. It is to be noted, however, that the appended drawings illustrate only typical embodiments of this disclosure and are therefore not to be considered limiting of its scope, for the disclosure may admit to other equally effective embodiments.

To facilitate understanding, identical reference numerals have been used, where possible, to designate identical elements that are common to the figures. It is contemplated that elements and features of one embodiment may be beneficially incorporated in other embodiments without further recitation.

DETAILED DESCRIPTION

Figure 1:
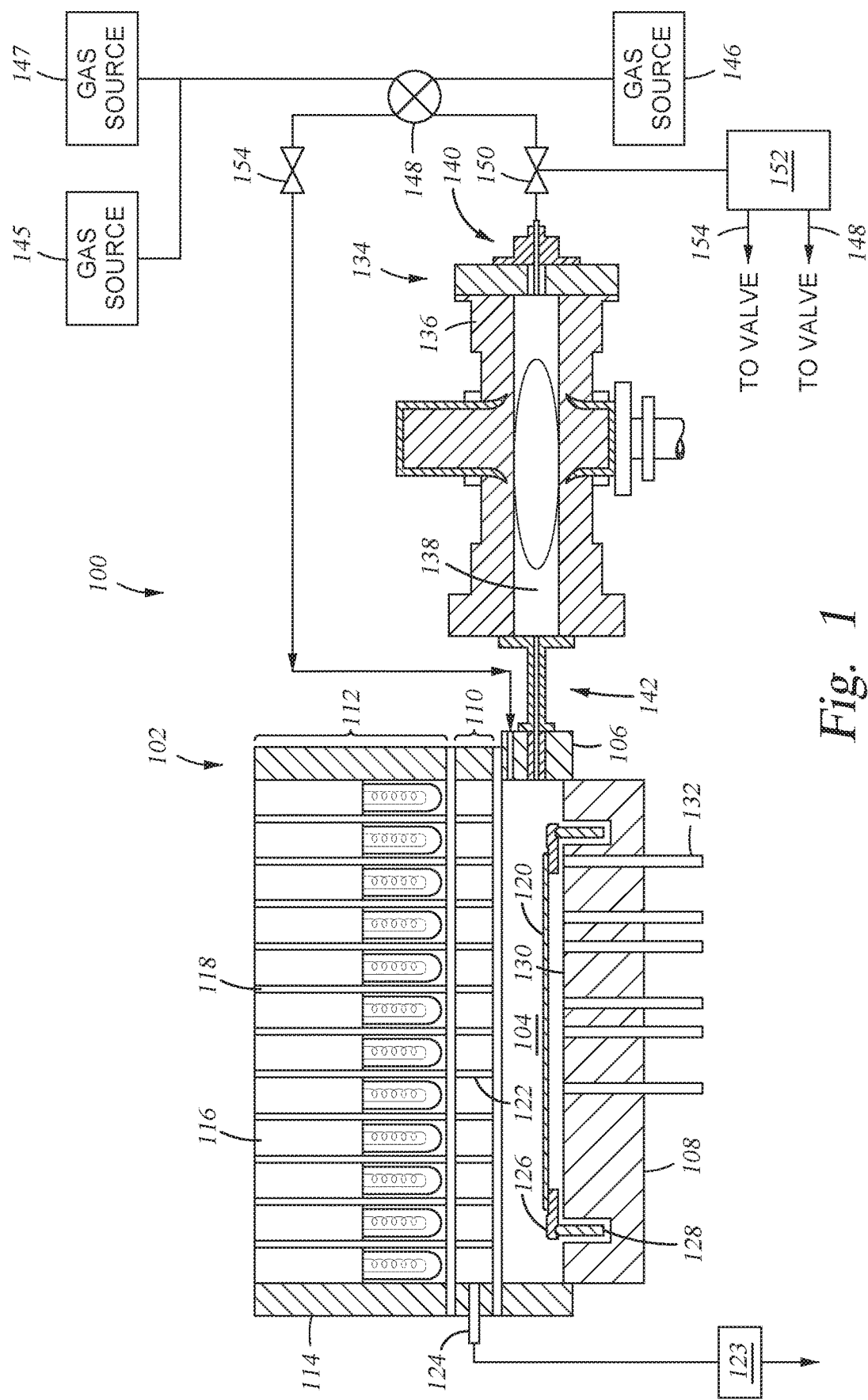
FIG. 1 is an exemplary system according to at least one embodiment described herein.

In the following description, numerous specific details are set forth to provide a more thorough understanding of the embodiments of the present disclosure. However, it will be apparent to one of skill in the art that one or more of the embodiments of the present disclosure may be practiced without one or more of these specific details. In other instances, well-known features have not been described in order to avoid obscuring one or more of the embodiments of the present disclosure.

Embodiments described herein generally relate to conformal oxidation processes used to form portions of a flash memory device. In conventional oxidation processes that are used to form gate structures, such as 3D NAND, $H_2$ and $O_2$ are typically used to form $SiO_2$ films on silicon nitride (SiNx) films. However, conventional processes that use a process gas that only contains molecular hydrogen ($H_2$) and molecular oxygen ($O_2$) result in fast growth rates of $SiO_2$ films on a silicon nitride (SiNx) film. When the growth rates are too fast, growth at the top of a high aspect ratio (HAR) feature will be greater than at the bottom of a feature. The higher growth rate at the top of the HAR feature (e.g., gate) causes a non-conformal film to form across the surface of the HAR feature and in some cases generates voids. However, it has been found that by using a process gas mixture that includes molecular hydrogen ($H_2$), molecular oxygen ($O_2$), and a nitrogen and oxygen bearing gas (e.g., nitrous oxide ($N_2O$)), as the only reactive gases in the process gas mixture, enables a method for controlling the growth of $SiO_2$ on a silicon nitride (SiNx) film layer to achieve desirable film properties, which includes film conformality and desirable electrical properties. While the disclosure provided herein primarily discusses the use of nitrous oxide ($N_2O$) as being the nitrogen and oxygen bearing gas, the use of $N_2O$ is not intended to be limiting as to the scope of the disclosure since other nitrogen and oxygen bearing gases (e.g., NO, $N_2O_3$, $NO_2$, $N_2O_4$, $N_2O_5$, $N(NO_2)_3$, etc.) may also be used.

To create a preferred growth rate of $SiO_2$ on SiNx films, embodiments in this disclosure use an in-situ stream generation (ISSG) process, an enhanced in-situ stream generation (EISSG), or a thermal combustion process that uses a process gas mixture that includes a ternary gas mixture of a hydrogen gas, an oxygen gas and nitrous oxide (e.g., $H_2+O_2+N_2O$) to form $SiO_2$ on a silicon (Si) containing compound. Silicon containing compounds can include poly silicon, crystalline silicon, and silicon nitride. A controllable $SiO_2$ growth rate can be achieved, in comparison with the use of a gas mixture that includes only $H_2$ and $O_2$ molecules, when the ternary gas mixture is provided to the surface of a HAR feature at one or more desired process conditions, which can include controlling the gas concentration ratio, gas pressure, and/or desired substrate temperature. While not intending to be bound by theory, it is believed that $N_2O$ acts as a reaction "inhibitor" or "barrier" to the reaction of $H_2$ and $O_2$ atoms with the silicon containing surfaces found in a device structure (e.g., gate structure). It is further believed that a lower growth rate results from a lower sticking coefficient of the $H_2$ and $O_2$ molecules found in the ternary gas mixture to the surfaces of the HAR features due to the adsorption of $N_2O$ on the surfaces. The lower sticking coefficient created by the control and adjustment of the oxidation process parameters allows an increased amount of $H_2$ and $O_2$ molecules to reach the bottom of a known HAR feature, improving the conformality in 3D NAND $SiO_2$ oxidation layers, specifically for ONO replacement tunneling gate formation.

FIG. 1 is an exemplary system 100 according to at least one embodiment described herein. Particularly, the system 100 may be used to selectively form a $SiO_2$ layer on a SiNx layer of a semiconductor structure, such as a NAND flash memory device. The system 100 includes a rapid thermal processing (RTP) apparatus 102. The RTP apparatus 102 generally includes a processing region 104 enclosed by a side wall 106 and a bottom wall 108. The upper portion of the side wall 106 is sealed to a window assembly 110 by O-rings. A radiant energy light pipe assembly 112 (enclosed by an upper side wall 114) is positioned over and coupled with the window assembly 110. The light pipe assembly 112 includes a plurality of tungsten halogen lamps 116 each mounted into light pipes 118 and positioned to adequately cover the entire surface area of a substrate 120. The window assembly 110 includes a plurality of light pipes 122. A vacuum is produced in the plurality of light pipes 122 by a vacuum pump 123 pumping through a tube 124 connected to one of the light pipes 122 which is connected to the rest of the pipes.

The substrate 120 is supported by a support ring 126 within the processing region 104. The support ring 126 is mounted on a rotatable cylinder 128. The rotatable cylinder 128 acts to rotate the support ring 126 and the substrate 120. The bottom wall 108 of the RTP apparatus 102 is coated or provided with a reflector 130 for reflecting energy onto the backside of the substrate 120. The RTP apparatus 102 also includes a plurality of fiber optic probes 132 positioned through the bottom wall 108 of the RTP apparatus 102 to detect the temperature of the substrate 120.

Gas sources 145, 146, and 147 are coupled with an inlet port 142 of the RTP apparatus 102 via a first input of a three-way valve 148 and a valve 150 used to control the flow rate of gas released from the gas sources 145, 146, and 147. A flow controller 152 is connected to the three way valve 148 to move the valve between different positions, depending upon which process is to be carried out. The flow controller 152 also functions in a similar fashion to control the three-way valve 148 and the valve 154 to provide an appropriate process gas flow from gas sources 145, 146, and 147 to the RTP apparatus 102.

An optional plasma applicator 134 may be coupled with the RTP apparatus 102 and used to remotely provide radicals of a plasma to the RTP apparatus 102. The optional plasma applicator 134 generally includes a body 136 surrounding a tube 138 where a plasma of ions, radicals, and electrons is generated. The tube 138 may be made of quartz or sapphire. The tube 138 preferably does not have any electrical bias present that might attract charged particles, e.g., ions. A gas inlet 140 is disposed at one end of the body 136 and is in fluid communication with the inlet port 142 of the RTP apparatus 102 such that radicals of the plasma generated within the tube 138 can be supplied to the processing region 104 of the RTP apparatus 102.

Figure 2A:
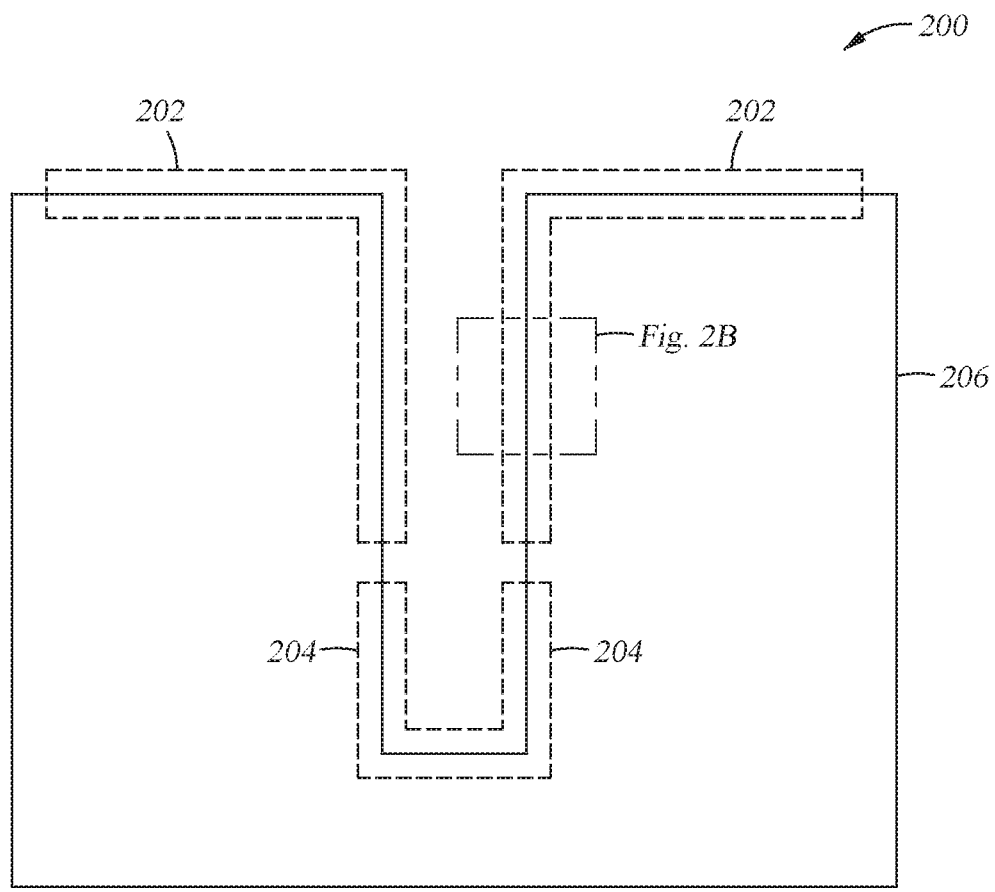
FIG. 2A-2B is high aspect ratio structure according to at least one embodiment described herein.
Figure 2B:
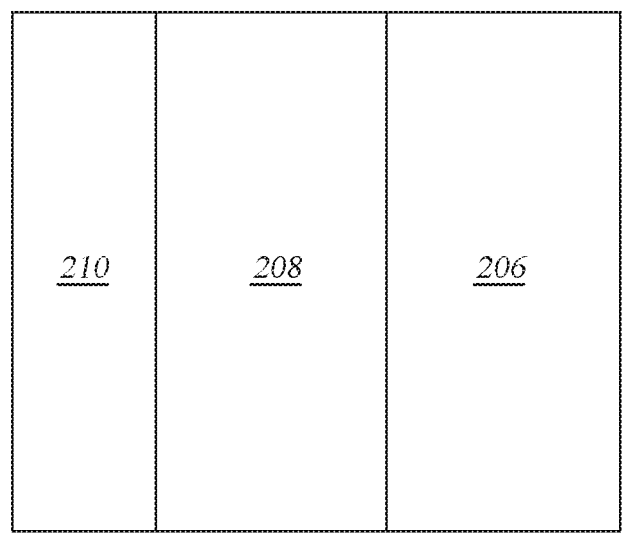

FIG. 2A-2B is a high aspect ratio structure 200 according to at least one embodiment described herein. FIG. 2A is a schematic side cross-sectional view of the high aspect ratio structure 200. FIG. 2B is a close up side cross-sectional view of a portion of a wall of the high aspect ratio structure 200 illustrated in FIG. 2A. The high aspect ratio structure 200 includes a substrate 206 with a top section 202 and a bottom section 204. In the methods described herein, a first layer 208 is formed on the substrate 206 and a second layer 210 is formed on the first layer 208. The substrate 206 may be a silicon substrate, but can be other similar materials. The first layer 208 may be a silicon nitride ($SiN_x$) layer, but can be other similar materials. The second layer 210 may be a silicon oxide ($SiO_2$) layer, but can be other similar materials. The substrate 206 can be positioned within the RTP apparatus 102, as discussed in FIG. 1. In conventional oxidation processes using a reactive gas mixture that essentially comprises $H_2$ and $O_2$ gases, the growth rate of the second layer 210 on the first layer 208 is typically too fast, especially at the early stages of the oxidation process. The fast growth rate is believed to be caused by a rapid reaction rate at most processing temperatures and processing pressures due to an inherently high sticking coefficient of these gases to the surface of the substrate, causing an oxide layer to preferentially grow on the walls within the top section 202 of the high aspect ratio structure 200 versus the bottom section 204 of the high aspect ratio structure 200. Ultimately, this results in a non-conformal second layer 210 on the high aspect ratio structure 200.

Contrarily, as described in embodiments herein, a ternary gas mixture of $N_2O$, $H_2$ and $O_2$ gases are used during processing. When using this mixture, it is believed that $N_2O$ acts as a barrier to the $H_2$ and $O_2$ atoms by sticking to the walls of the gate structures, leading to slower growth rate of the second layer 210 on the first layer 208 in comparison with using only $H_2$ and $O_2$ molecules.

The system 100 is configured so that each of the $N_2O$, $H_2$, and $O_2$ gases are stored in and delivered from one of the gas sources 145, 146, and 147. The gases enter the RTP apparatus 102 via an inlet port 142 connecting the gas sources 145, 146, and 147 to the RTP apparatus 102. In one example, when the RTP apparatus 102 is heated to a temperature between about 700° C. and about 1100° C., the process pressure is controlled to between about 1 Torr and about 20 Torr, the $N_2O$, $H_2$, and $O_2$ gas mixture is able to provide a controllable initial growth of the oxide film. As noted above, it believed that the addition of $N_2O$ reduces the oxide layer growth rate due to its presence in the process chamber by decreasing the sticking coefficient and/or altering the reaction kinetics created between the $H_2$ and $O_2$ gases and the surface of the HAR feature as compared to gas mixtures found in conventional oxidation processes. As such, embodiments using a mixture of $N_2O$, $H_2$, and $O_2$ gases result in more conformal second layer 210 on the high aspect ratio structure 200.

In some embodiments, the oxidation process includes one or more process variables, such as the % of volume concentration of $H_2$, $O_2$, and $N_2O$, temperature, pressure, flow rates, and soak time which may vary. For example, a ternary gas mixture contains $O_2$ at a concentration of between 0% and about 40% by volume, $H_2$ at a concentration of between about 1% and about 10% by volume, $N_2O$ at a concentration of between about 50% and about 98% by volume. In another example, a ternary gas mixture contains $O_2$ at a concentration of between 0.1% and about 40% by volume, $H_2$ at a concentration of between about 1% and about 10% by volume, $N_2O$ at a concentration of between about 50% and about 98% by volume. The temperature of the substrate support during processing can be between about 700 degrees C. and about 1100 degrees C., the pressure of the processing region can be controlled between about 1 Torr and about 20 Torr, and the soak time can be between 30 seconds and 140 seconds. The flow rate of $H_2$ can be between about 0.2 and about 2.0 standard liter per minute (SLM), the flow rate of $O_2$ can be between about 0.2 and about 8.0 SLM, the flow rate of $N_2O$ can be between about 10.0 and 20.0 SLM. In another example, $O_2$ can be at a concentration of between about 5% and about 20% by volume, $H_2$ can be at a concentration of between about 1% and about 10% by volume, and $N_2O$ can be at a concentration of between about 70% and about 95% by volume. The temperature of the substrate support can be between about 800 degrees C. and about 1100 degrees C., the pressure of the processing region can be controlled between about 9 Torr and about 18 Torr, and the soak time can be between 100 seconds and 140 seconds. In yet another example, $O_2$ can be at a concentration of between about 20% and about 35% by volume, $H_2$ can be at a concentration of between about 5% and about 10% by volume, $N_2O$ can be at a concentration of between about 55% and about 75% by volume. The temperature of the substrate support can be between about 800 degrees C. and about 1100 degrees C., the pressure of the processing region can be controlled between about 9 Torr and about 18 Torr, and the soak time can be between 100 seconds and 140 seconds. Processes using these variables can result in growth rates between about 0.5 angstroms/sqrt(time) and about 2.0 angstroms/sqrt(time), such as about 1.0 angstroms/sqrt (time). The resulting thickness of the second layer 210 on the high respect radio structure 200 can be between about 5 angstroms and about 30 angstroms.

Figure 3:
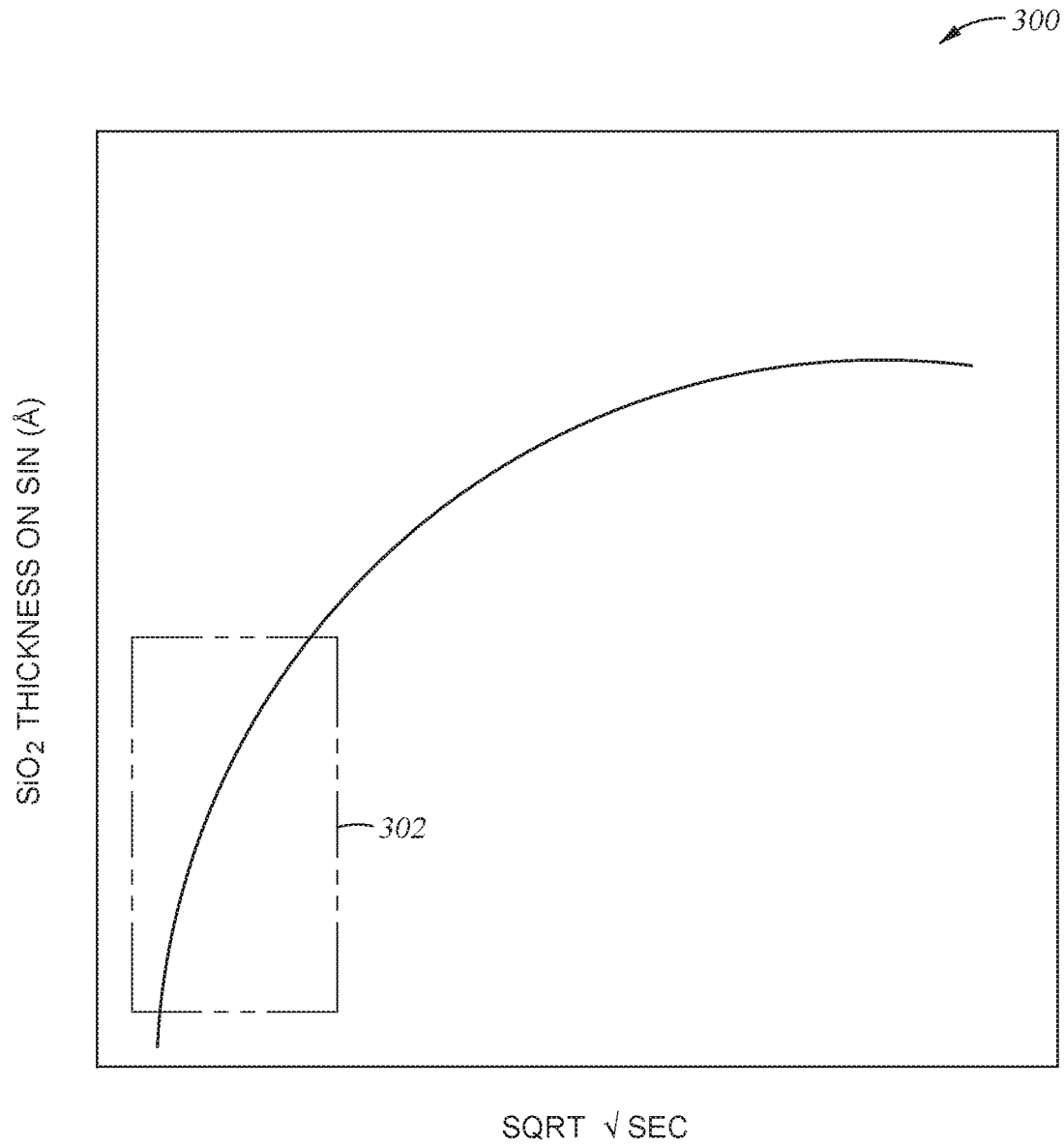
FIG. 3 is a graph of thickness as a function of time according to at least one embodiment described herein.

FIG. 3 is a graph of thickness as a function of time according to at least one embodiment described herein. As shown in the graph 300 in FIG. 3, embodiments described herein have shown significant advantages over prior conventional processes, especially at the initial stages of growth which typically have the highest growth rates, as shown in the growth rate region 302. In the growth rate region 302, growth rates are initially very fast, and thus it is hard to control the quality of the formed oxide layer. Therefore, if growth rates are controlled within the growth rate region 302 using the processes described herein, the properties of the formed layer can be better controlled for this typically important interfacial region of the formed layer. In some embodiments, the initial portion of the layer is formed using the oxidation process described above until the film thickness has grown to a level that it is outside of the growth rate region 302, and then a faster growth rate process can be used to achieve the final desired layer thickness. For example, a radical plasma process can be applied using the optional plasma applicator 134 described above after the film thickness has reached a thickness that is outside of the growth rate region 302. The radical plasma process can have a gas mixture that includes hydrogen and oxygen.

Figure 4A:
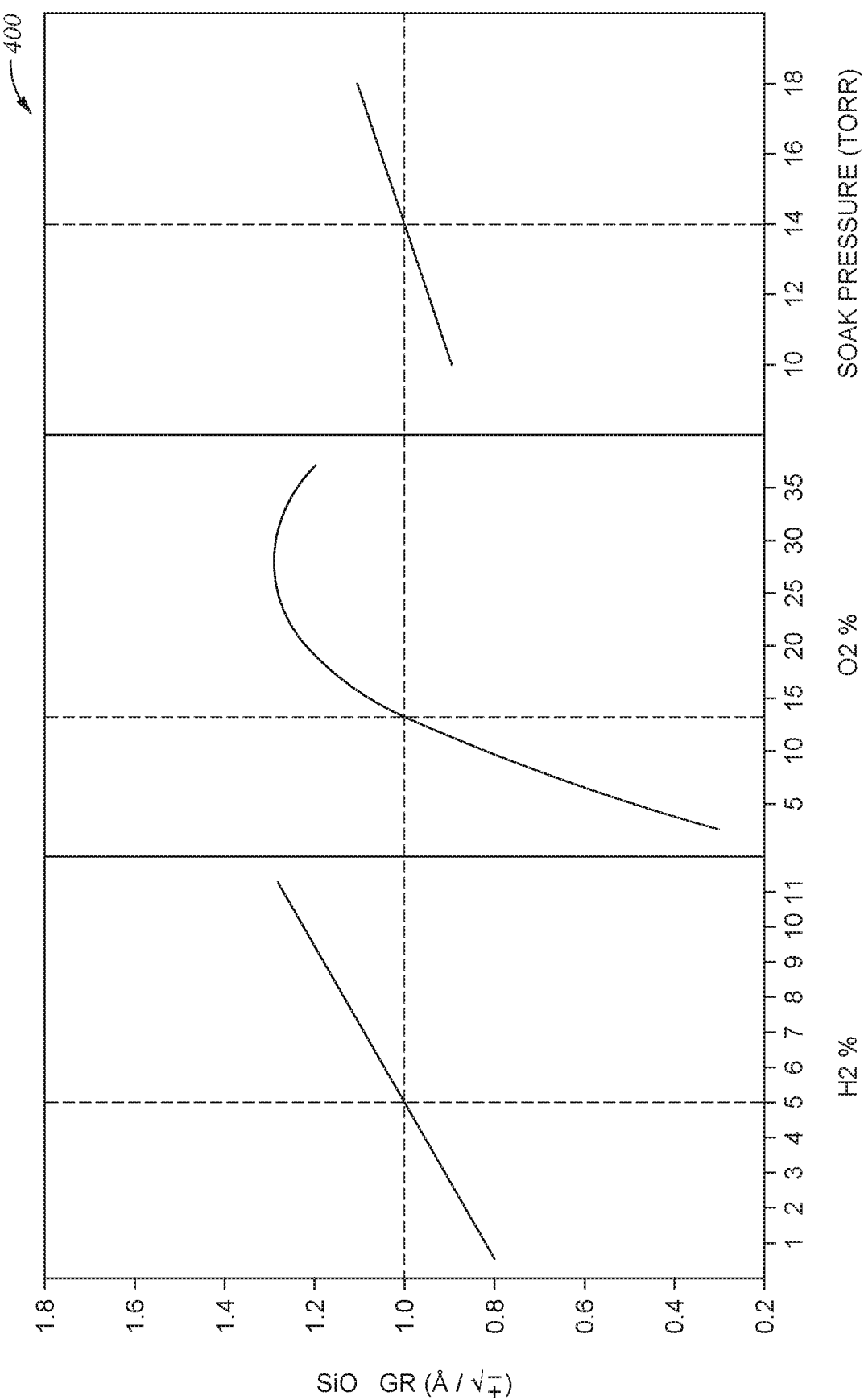
FIG. 4A is a graph of growth rate as a function of $H_2$, $O_2$, and pressure according to at least one embodiment described herein.

FIG. 4A is a graph 400 of growth rate as a function of $H_2$, $O_2$, and pressure according to at least one embodiment herein. The y-axis of the graph 400 represents the growth rate of the second layer 210 on the first layer 208. In these embodiments, the second layer 210 is $SiO_2$. The x-axis of the graph 400 shows % of volume concentration of $H_2$ and $O_2$ within the processing region 104 of the RTP apparatus 102 and also shows the pressure within the processing region 104. The pressure is measured in Torr. More specifically, the graphs in FIG. 4A were generated by use of a design of experiments (DOE) in which the concentration of $H_2$ was varied between about 1% and about 10%, the concentration of $O_2$ was varied between 0% and about 40%, and the balance of the process gases included $N_2O$. Keeping the concentration of $H_2$ and $O_2$ gases by volume within these ranges, with a background of $N_2O$, acts to keep the growth rates at their desired range. In addition to the gas mixtures, controlling the pressure is also a variable used to achieve the desired growth rate. As shown in the graph 400, the pressure to achieve the desired growth rate is shown between about 9 and 18 Torr, although other pressures can also achieve the desired growth rate.

Figure 4B:
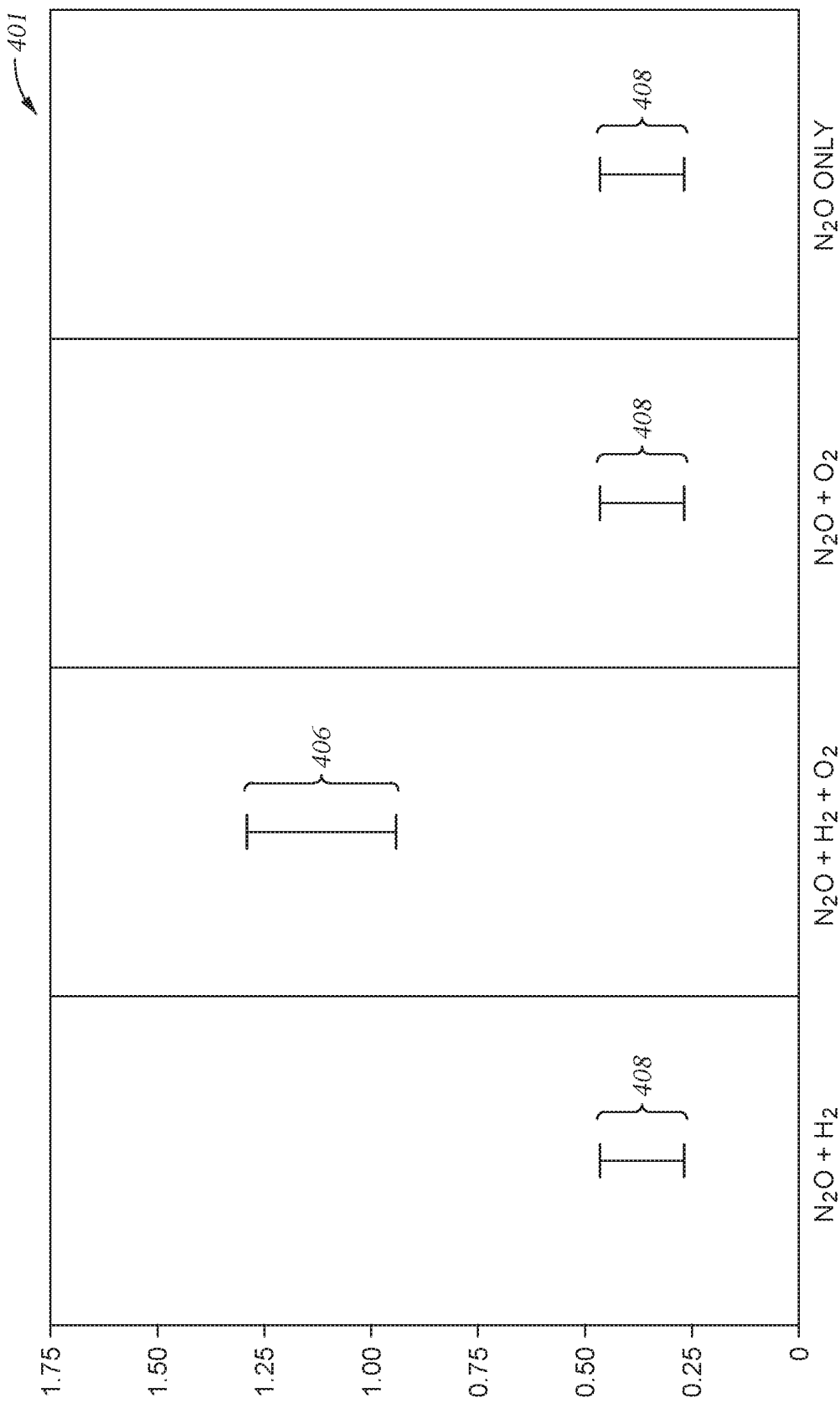
FIG. 4B graph of growth rate as a function of chemistry according to at least one embodiment described herein.

FIG. 4B shows a graph 401 of growth rate as a function of chemistry according to at least one embodiment described herein. Contrarily, as illustrated by graph 401, processes using a gas mixture of $N_2O$ and $H_2$, $N_2$ and $O_2$, and $N_2O$ only have negligible growth rates within a range 408. $SiO_2$ films do not reliably grow on $SiN_x$ with growth rates this slow. However, when $N_2O$ is mixed with both $O_2$ and $H_2$, it results in growth rates within a desired range, such as range 406. Therefore, the mixture of $N_2O$, $H_2$, and $O_2$ provides optical growth rates that are neither too fast nor negligible. As described above, but not shown in FIG. 4B, processes using a gas mixture using only $H_2$ and $O_2$ have growth rates that are very fast, such as three to five times the growth rate measured for the ternary gas mixture. Growth rates within the optimal range reduce or eliminate the problems associated with fast growth rates, such as non-conformal films. Additionally, growth rates within the optimal range reduces or eliminates the problems associated with slow growth rates, such as the inability to grow films.

Figure 5:
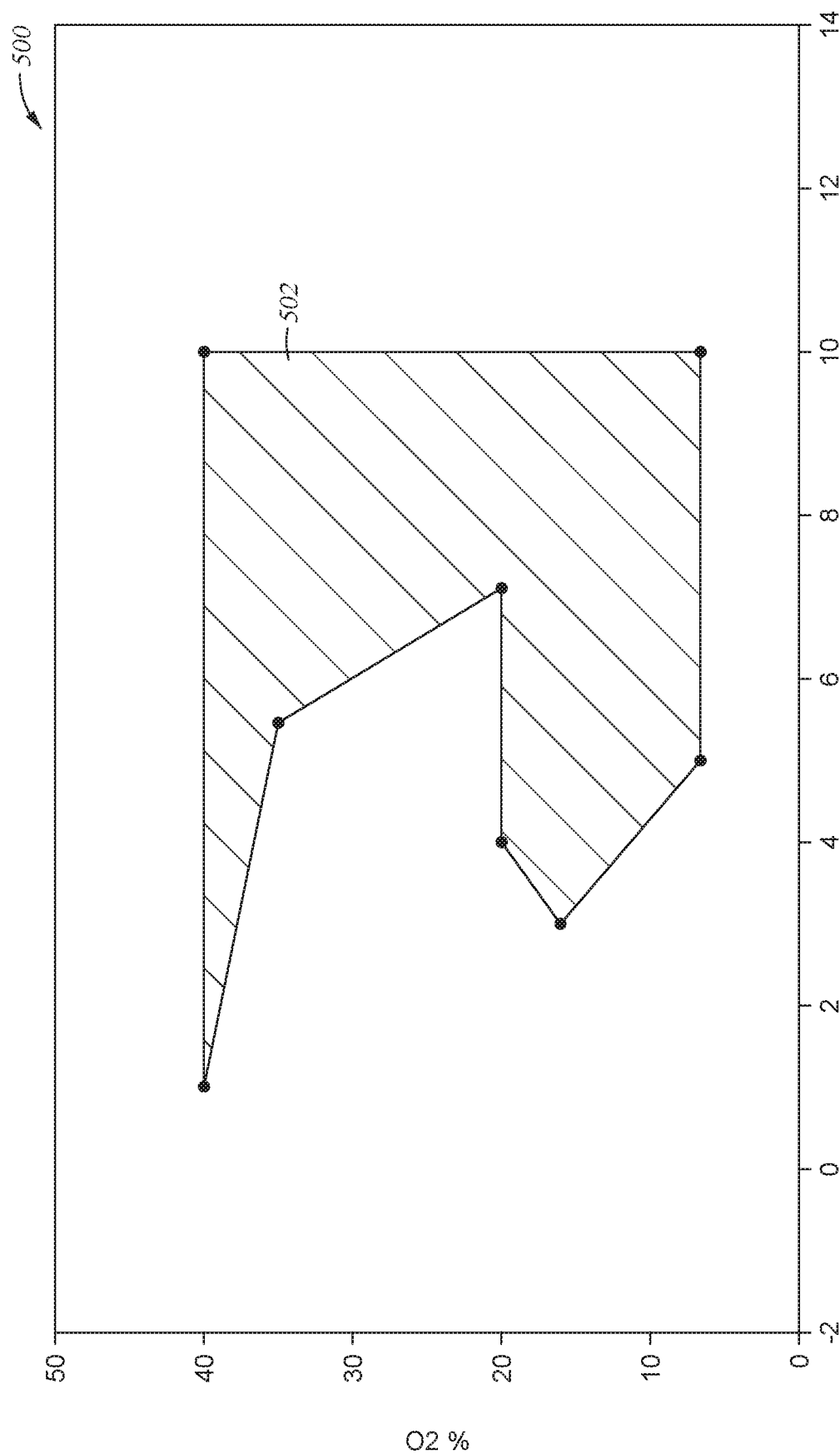
FIG. 5 is a graph showing $H_2$ and $O_2$ ranges that result in the desired growth rate according to at least one embodiment described herein.

FIG. 5 is a graph 500 showing ranges of $H_2$ and $O_2$ concentration, with the remaining gas composition being $N_2O$, that result in the desired growth rate according to at least one embodiment herein. Region 502 within the graph 500 represents the % of volume concentration of $H_2$ and $O_2$ gases that achieve the desired growth rate in the processing region 104. Note that in these examples the remaining volume percent of reactive gases substantially includes $N_2O$. In some cases, a carrier gas may also be used. The y-axis of the graph 500 represents the % volume concentration of $O_2$ while the x-axis of graph 500 represents the % volume of concentration of $H_2$. For example, in some embodiments using a design of experiments, $O_2$ can be between 0% and about 40% by volume; $H_2$ can be between about 1% and about 10% by volume, and $N_2O$ can be between about 50% and about 98% by volume. In another example, $O_2$ can be between about 20% and about 35% by volume; $H_2$ can between about 5% and about 10% by volume; and $N_2O$ can be between about 55% and about 75% by volume. In another example, $O_2$ can be between about 35% and about 40% by volume; $H_2$ can be between about 1% and about 10% by volume; and $N_2O$ can be between about 50% and about 65% by volume; Although these variations are shown in the region 502 of graph 500, other variations are also possible. Other process variables such as temperature, pressure, flow rates, and soak time can also vary. For example, the temperature of the substrate support can be between about 700 degrees C. and about 1100 degrees. The pressure of the processing region can be controlled between about 1 Torr and about 20 Torr. The flow rate of $H_2$ can be between about 0.2 and about 2.0 standard liter per minute (SLM), the flow rate of $O_2$ between about 1.5 and about 8.0 SLM, and the flow rate of $N_2O$ between about 10.0 and 20.0 SLM. Soak times can vary between 30 seconds and 140 seconds. Processes using these variables in the ranges discussed above can result in desired growth rates between about 0.5 angstroms (Å)/sqrt(time) and about 2.0 Å/sqrt(t), such as about 1.0 Å/sqrt(t). The resulting thickness of the second layer 210 on the high respect radio structure 200 can be between about 5 angstroms and about 30 angstroms, such as between about 10 angstroms and about 15 angstroms.

Figure 6:
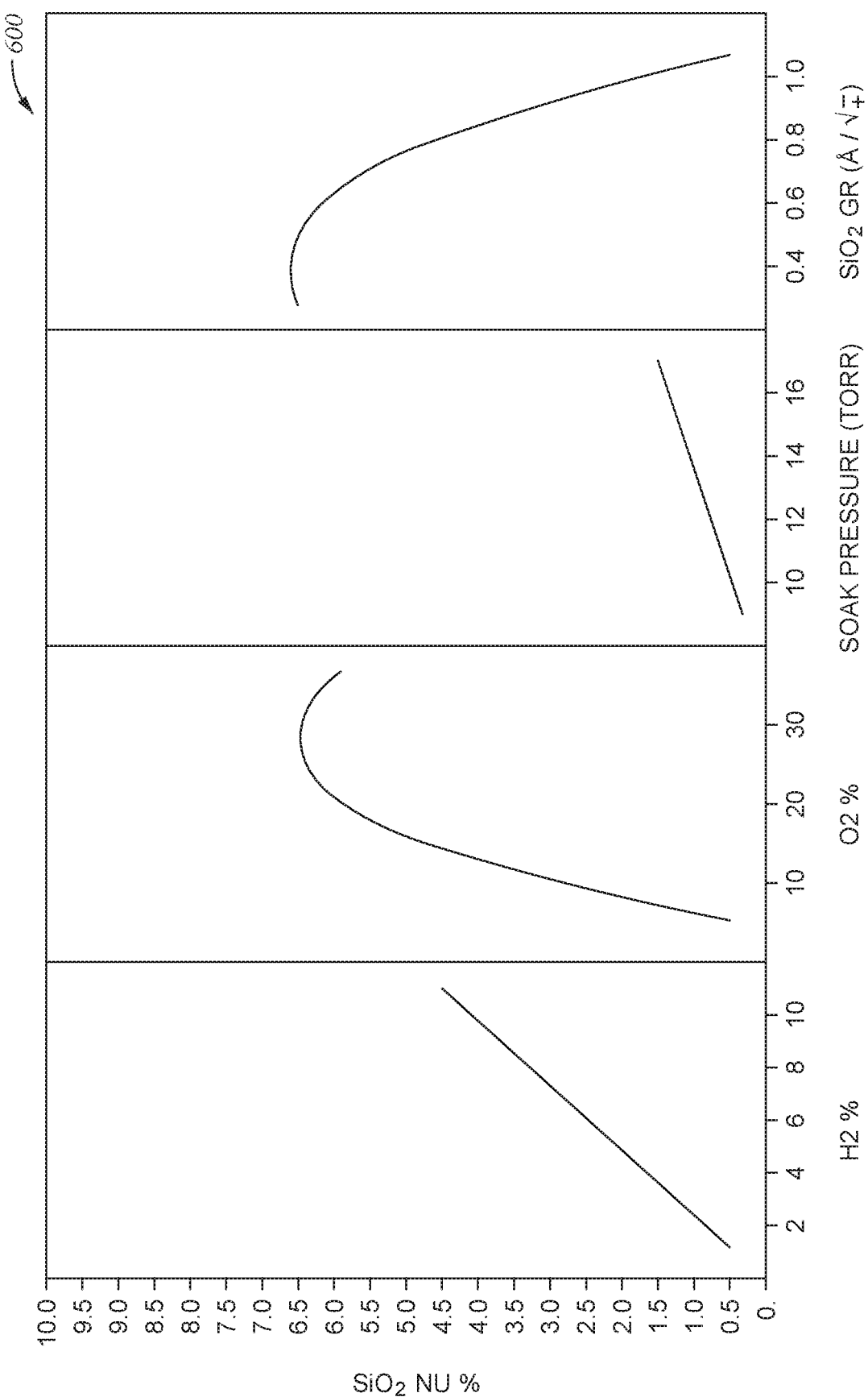
FIG. 6 is a graph of non-uniformity as a function of $H_2$, $O_2$, pressure, and growth rate according to at least one embodiment described herein.

FIG. 6 is a graph 600 of non-uniformity as a function of $H_2$, $O_2$, pressure, and growth rate according to at least one embodiment herein. The y-axis of the graph 600 represents non-uniformity % of the second layer 210. Like FIG. 4A, in these embodiments the second layer 210 is $SiO_2$. The x-axis of the graph 600 represents % of volume concentration of $H_2$ and $O_2$ within the processing region 104 of the RTP apparatus 102; the pressure within the processing region 104; and the growth rate of the second layer 210 on the first layer 208. The pressure is measured using Torr. The growth rate is calculated using the units angstroms (Å)/sqrt(time), where time is measured in seconds (s). As shown in the graph 600, the non-uniformity % drops as the percentage of $H_2$ and $O_2$ gases decreases. Additionally, the non-uniformity % drops as the pressure with the RTP apparatus 102 drops. Finally, as the growth rate of $SiO_2$ decreases with the lower $H_2$ and $O_2$ percentages, the non-uniformity % drops. Therefore, with lower $H_2$ and $O_2$ percentages, the second layer 210 becomes more uniform as it forms over the first layer 208. Greater uniformity of the second layer 210 makes it easier to form layers on top of the second layer 210, creating better overall uniformity of the high aspect ratio structure 200.

While the foregoing is directed to embodiments of the present disclosure, other and further embodiments of the disclosure may be devised without departing from the basic scope thereof, and the scope thereof is determined by the claims that follow.

We claim:

1. A method of processing a substrate, comprising:
    exposing a structure formed on a substrate to a process gas by flowing a hydrogen gas, an oxygen gas, and a nitrous oxide gas into a processing volume of a chamber body, wherein a concentration of the hydrogen gas is between about 1% and about 10% by volume, a concentration of the oxygen gas is between about 5% and about 20% by volume, and a concentration of nitrous oxide gas is between about 70% and about 95% by volume within the processing volume, wherein none of the components of the process gas are exposed to a plasma during the process of exposing of the structure to the process gas;
    heating a substrate support, supporting the substrate within the processing volume, to a temperature between about 800° C. and about 1100° C.; and
    controlling a processing pressure within the processing volume to a pressure between about 9 Torr and about 20 Torr.

2. The method of claim 1, wherein the method results in an oxygen containing film being formed on the structure that has a thickness of between about 5 angstroms and about 30 angstroms.

3. The method of claim 2, wherein the film is a silicon oxide film that is formed on a silicon nitride ($SiN_x$) containing film that is formed over a surface of the structure.

4. The method of claim 1, wherein a flow rate of the hydrogen gas is between about 0.2 and about 2.0 SLM, a flow rate of the oxygen gas is between about 1.5 and about 8.0 SLM, and a flow rate of the nitrous oxide gas is between about 10.0 and 20.0 SLM within the processing volume when exposing the structure formed on the substrate to the process gas.

5. The method of claim 1, wherein the exposing the structure formed on the substrate to the process gas further comprises a soak time of between about 100 seconds and about 140 seconds.

6. The method of claim 1, wherein the substrate comprises silicon.

7. A method of processing a substrate, comprising:
initiating conformal oxidation of high aspect ratio structures of the substrate comprising:
- flowing a hydrogen gas, an oxygen gas, and a nitrous oxide gas into a processing volume of a chamber body, wherein a volume concentration of the hydrogen gas is between about 5% and about 10%, a volume concentration of the oxygen gas is between about 20% and about 35%, and a volume concentration of nitrous oxide gas is between about 55% and about 75% within the processing volume;
- heating a substrate support, supporting the substrate within the processing volume, to a temperature between about 800 degrees C. and about 1100 degrees C.; and
- controlling a processing pressure within the processing volume of the chamber body between about 9 Torr and about 18 Torr.

8. The method of claim 7, wherein the method results in a film on the high respect radio structures with a thickness between about 10 angstroms and about 15 angstroms.

9. The method of claim 7, wherein the film is a silicon oxide film that is formed on a silicon nitride ($SiN_x$) containing film that is formed over a surface of the structure.

10. The method of claim 7, wherein a flow rate of the hydrogen gas is between about 0.2 and about 2.0 SLM, a flow rate of the oxygen gas is between about 1.5 and about 8.0 SLM, and a flow rate of the nitrous oxide gas is between about 10.0 and 20.0 SLM.

11. The method of claim 7, wherein a soak time of the substrate is between about 100 seconds and about 140 seconds.

12. The method of claim 7, wherein the substrate comprises silicon.

* * * * *